(12) United States Patent
Kim et al.

(10) Patent No.: US 10,811,450 B2
(45) Date of Patent: Oct. 20, 2020

(54) IMAGE SENSORS

(71) Applicant: Samsung Electronics Co., Ltd., Suwon-si, Gyeonggi-do (KR)

(72) Inventors: Bomi Kim, Yeongju-si (KR); BumSuk Kim, Hwaseong-si (KR); Jung-Saeng Kim, Seoul (KR); Yun Ki Lee, Hwaseong-si (KR); Taesub Jung, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/123,092

(22) Filed: Sep. 6, 2018

(65) Prior Publication Data
US 2019/0214421 A1 Jul. 11, 2019

(30) Foreign Application Priority Data
Jan. 9, 2018 (KR) .......................... 10-2018-0002920

(51) Int. Cl.
*H01L 27/146* (2006.01)
*H04N 5/341* (2011.01)

(52) U.S. Cl.
CPC .... *H01L 27/14621* (2013.01); *H01L 27/1463* (2013.01); *H01L 27/1464* (2013.01); *H01L 27/14685* (2013.01); *H04N 5/341* (2013.01); *H01L 27/14627* (2013.01)

(58) Field of Classification Search
CPC .................. H01L 27/14621; H01L 27/14645
See application file for complete search history.

(56) References Cited

U.S. PATENT DOCUMENTS

| | | |
|---|---|---|
| 6,628,331 B1 | 9/2003 | Bean |
| 6,864,022 B2 | 3/2005 | Machiguchi et al. |
| 7,990,445 B2 | 8/2011 | Rhodes et al. |
| 8,259,201 B2 | 9/2012 | Stuck et al. |
| 9,673,236 B2 | 6/2017 | Jin et al. |
| 9,926,664 B2 | 3/2018 | Kono et al. |
| 2009/0086065 A1 | 4/2009 | Kim et al. |
| 2009/0115874 A1 | 5/2009 | Kim et al. |
| 2016/0056198 A1 | 2/2016 | Lee et al. |
| 2017/0104020 A1 | 4/2017 | Lee et al. |
| 2017/0154911 A1 | 6/2017 | Jin et al. |

FOREIGN PATENT DOCUMENTS

| | | |
|---|---|---|
| JP | 5037044 B2 | 9/2012 |
| JP | 2017098533 A | 6/2017 |

OTHER PUBLICATIONS

Singapore Search Report corresponding to Application No. 10201900129Q (dated Jul. 11, 2019; 2 pages).
Extended European Search Report corresponding to EP3509107 (dated Aug. 2, 2019) (9 pages).

*Primary Examiner* — Wael M Fahmy
*Assistant Examiner* — Sarah K Salerno
(74) *Attorney, Agent, or Firm* — Myers Bigel, P.A.

(57) ABSTRACT

Image sensors are provided. The image sensors may include a plurality of unit pixels and a color filter array on the plurality of unit pixels. The color filter array may include a color filter unit including four color filters that are arranged in a two-by-two array, and the color filter unit may include two yellow color filters, a cyan color filter, and one of a red color filter or a green color filter.

20 Claims, 14 Drawing Sheets

US 10,811,450 B2

IMAGE SENSORS

CROSS-REFERENCE TO RELATED APPLICATION

This U.S. non-provisional application claims priority under 35 U.S.C § 119 to Korean Patent Application No. 10-2018-0002920 filed on Jan. 9, 2018, in the Korean Intellectual Property Office, the disclosure of which is hereby incorporated by reference in its entirety.

BACKGROUND

The present disclosure generally relates to an image sensor, and more particularly, to a complementary metal oxide semiconductor (CMOS) image sensor.

Image sensors convert optical images into electrical signals. Recent advances in the computer and communication industries have led to strong demand for high performance image sensors in various consumer electronic devices such as digital cameras, camcorders, PCSs (Personal Communication Systems), game devices, security cameras, medical micro-cameras, etc.

Image sensors encompass various types, including a charge coupled device (CCD) type and a complementary metal oxide semiconductor (CMOS) type. Operation of CMOS image sensors may be less complicated, and sizes of CMOS image sensors may be possibly minimized since signal processing circuits could be integrated into a single chip. CMOS image sensors may consume relatively small amount of power and thus may be beneficial in view of battery capacity. In addition, since manufacturing processes of CMOS image sensors may be compatible with CMOS process technology, the CMOS image sensors may be manufactured with low cost.

SUMMARY

Embodiments of the inventive concept provide image sensors with improved optical characteristics.

According to example embodiments of inventive concept, image sensors may include a plurality of unit pixels and a color filter array on the plurality of unit pixels. The color filter array may include a color filter unit including four color filters that are arranged in a two-by-two array, and the color filter unit may include two yellow color filters, a cyan color filter, and one of a red color filter or a green color filter.

According to example embodiments of inventive concept, images sensor may include a color filter including two yellow color filters, a cyan color filter, and a red color filter that are in a two-by-two array:

$$\begin{bmatrix} Y & R \\ C & Y \end{bmatrix}$$

Y represents one of the two yellow color filters, C represents the cyan color filter, and R represents the red color filter.

According to example embodiments of inventive concept, image sensors may include a substrate including a plurality of photoelectric conversion devices and a color filter unit on the substrate. The color filter unit may include four color filters including two first color filters, a second color filter, and a third color filter that are in a two-by-two array:

$$\begin{bmatrix} \text{first color filter} & \text{third color filter} \\ \text{second color filter} & \text{first color filter} \end{bmatrix}$$

Each of the two first color filters and the second color filter may be a complementary color filter, and the third color filter may be a primary color filter.

DETAILED DESCRIPTION

Figure 1:
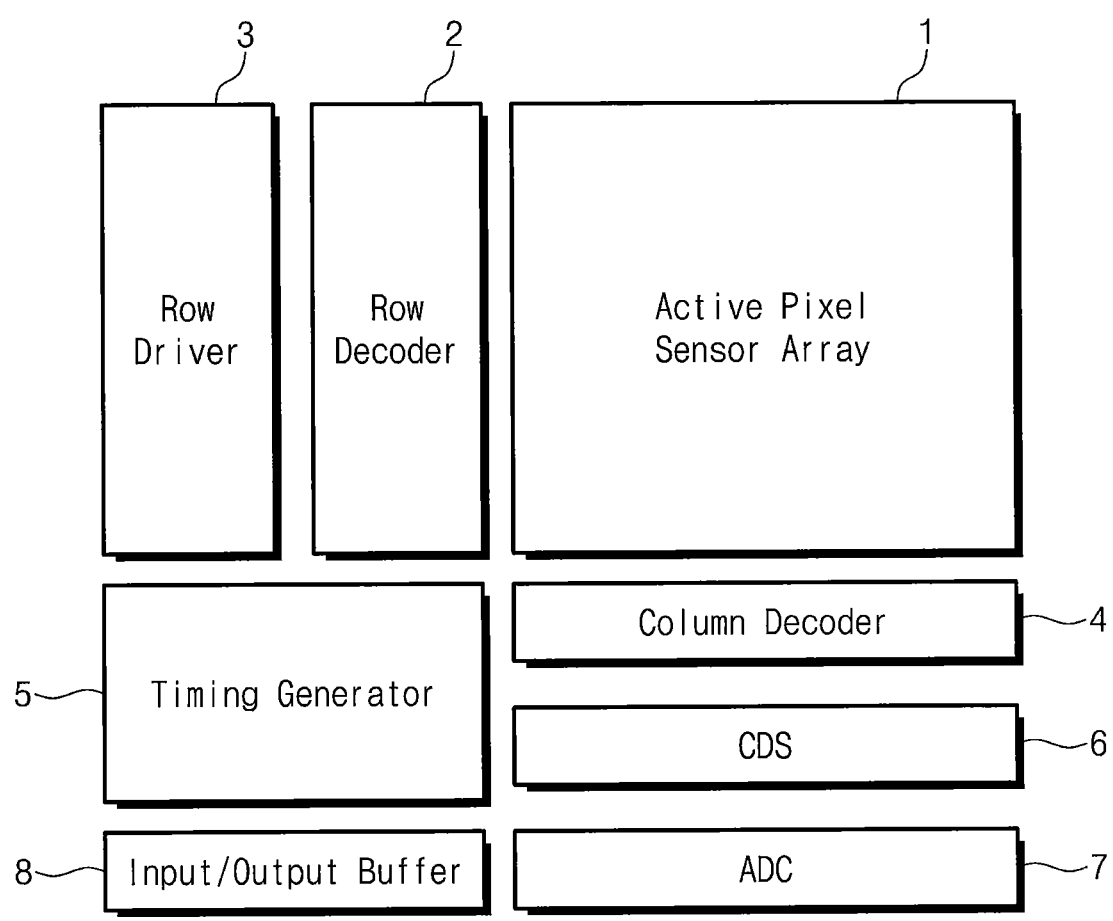
FIG. 1 illustrates a block diagram of an image sensor according to example embodiments of the present inventive concept.

As used herein the term "and/or" includes any and all combinations of one or more of the associated listed items. It will be understood that like reference numerals refer to like parts throughout the various figures unless otherwise specified.

It will be understood that "formed concurrently" refers to being formed in a same fabrication step, at approximately (but not necessarily exactly) the same time.

FIG. 1 illustrates a block diagram of an image sensor according to example embodiments of the inventive concept.

Referring to FIG. 1, an image sensor may include an active pixel sensor array (APS) 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of two-dimensionally arranged unit pixels, each of which is configured to convert optical signals into electrical signals. The active pixel sensor array 1 may be driven by a plurality of driving signals such as, for example, a pixel select signal, a reset signal, and/or a charge transfer signal that the row driver 3 generate and/or provide. The correlated double sampler 6 may be provided with the converted electrical signals.

The row driver 3 may provide the active pixel sensor array 1 with driving signals for driving unit pixels in accordance with a decoded result obtained from the row decoder 2. When the unit pixels are arranged in a matrix shape, the driving signals may be supplied to respective rows.

The timing generator 5 may provide the row decoder 2 and the column decoder 4 with timing and control signals.

The correlated double sampler 6 may receive the electrical signals generated in the active pixel sensor array 1 and may hold and/or sample the received electrical signals. The correlated double sampler 6 may perform a double sampling operation to sample a specific noise level and a signal level of the electrical signal and then may output a difference level corresponding to a difference between the noise and signal levels.

The analog-to-digital converter (ADC) 7 may convert analog signals, which correspond to the difference level output from the correlated double sampler 6, into digital signals and then may output the converted digital signals.

The input/output buffer 8 may latch the digital signals and then may sequentially output the latched digital signals to an image signal processing unit (not shown) in response to the decoded result obtained from the column decoder 4.

Figure 2:
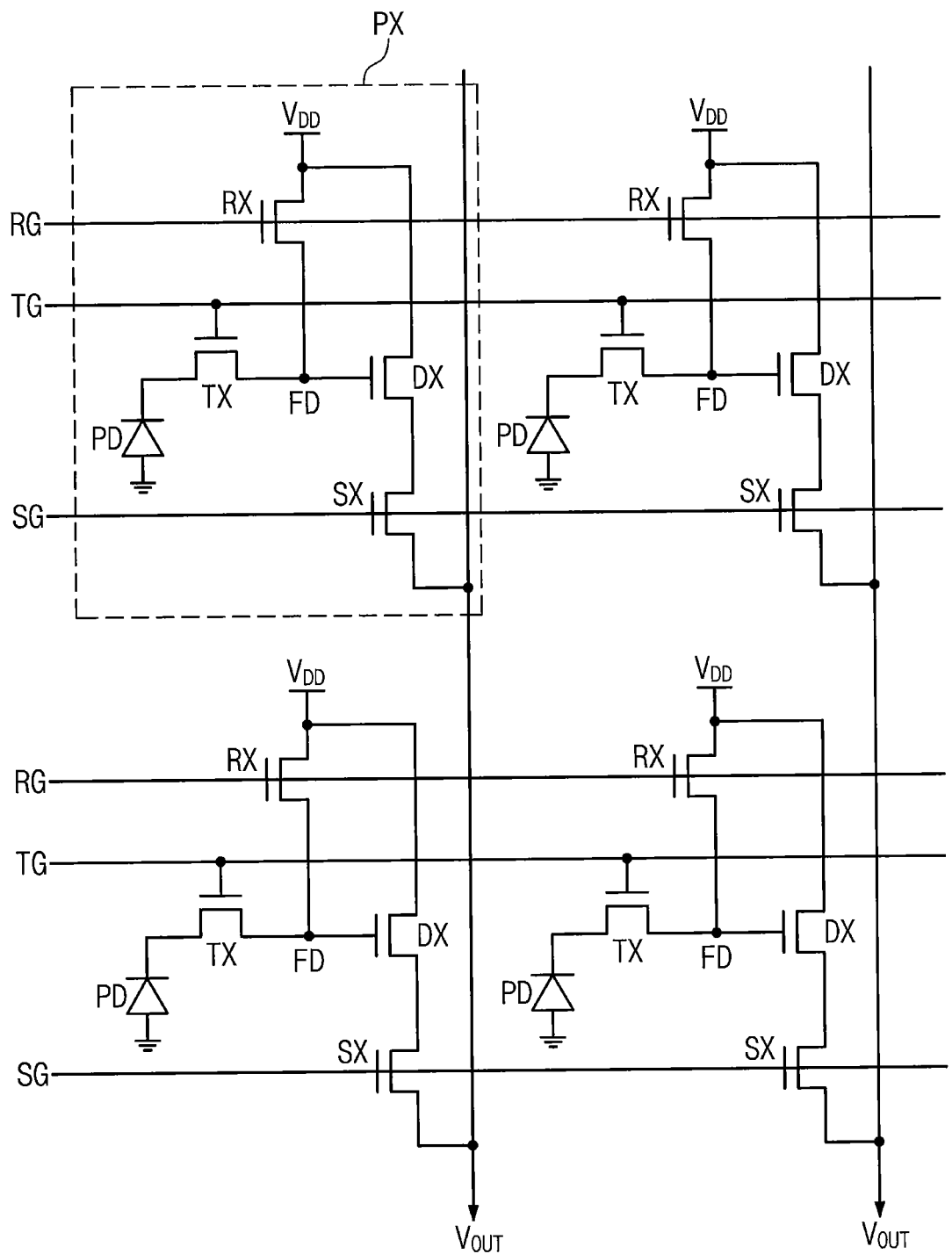
FIG. 2 illustrates a circuit diagram of an active pixel sensor array of an image sensor according to example embodiments of the present inventive concept.

FIG. 2 illustrates a circuit diagram showing an active pixel sensor array of an image sensor according to example embodiments of the inventive concept.

Referring to FIGS. 1 and 2, a sensor array 1 may include a plurality of unit pixels PX, which may be arranged in a matrix shape. Each of the unit pixels PX may include a transfer transistor TX and logic transistors RX, SX, and DX. The logic transistors may include a reset transistor RX, a select transistor SX, and a drive transistor DX. The transfer transistor TX may include a transfer gate TG. Each of the unit pixels PX may further include a photoelectric conversion device PD and a floating diffusion region FD.

The photoelectric conversion device PD may generate and accumulate photo-charges in proportion to an amount of externally incident light. The photoelectric conversion device PD may include, for example, a photodiode, phototransistor, a photogate, a pinned photodiode, or a combination thereof. The transfer transistor TX may transfer the charges generated in the photoelectric conversion device PD into the floating diffusion region FD. The floating diffusion region FD may accumulatively store the charges generated and transferred from the photoelectric conversion device PD. The drive transistor DX may be controlled by an amount of photo-charges accumulated in the floating diffusion region FD.

The reset transistor RX may periodically reset the charges accumulated in the floating diffusion region FD. The reset transistor RX may have a drain electrode connected to the floating diffusion region FD and a source electrode connected to a power voltage $V_{DD}$. When the reset transistor RX is turned on, the floating diffusion region FD may be supplied with the power voltage $V_{DD}$ connected to the source electrode of the reset transistor RX. Accordingly, when the reset transistor RX is turned on, the charges accumulated in the floating diffusion region FD may be exhausted and thus the floating diffusion region FD may be reset. The reset transistor RX may include a reset gate RG.

The drive transistor DX may serve as a source follower buffer amplifier. The drive transistor DX may amplify a variation (e.g., change) in electrical potential of the floating diffusion region FD and output the amplified electrical potential to an output line $V_{OUT}$.

The select transistor SX may select each row of the unit pixels PX that are to be readout. When the select transistor SX is turned on, the power voltage $V_{DD}$ may be applied to a drain electrode of the drive transistor DX. The select transistor SX may include a select gate SG.

Figure 3:
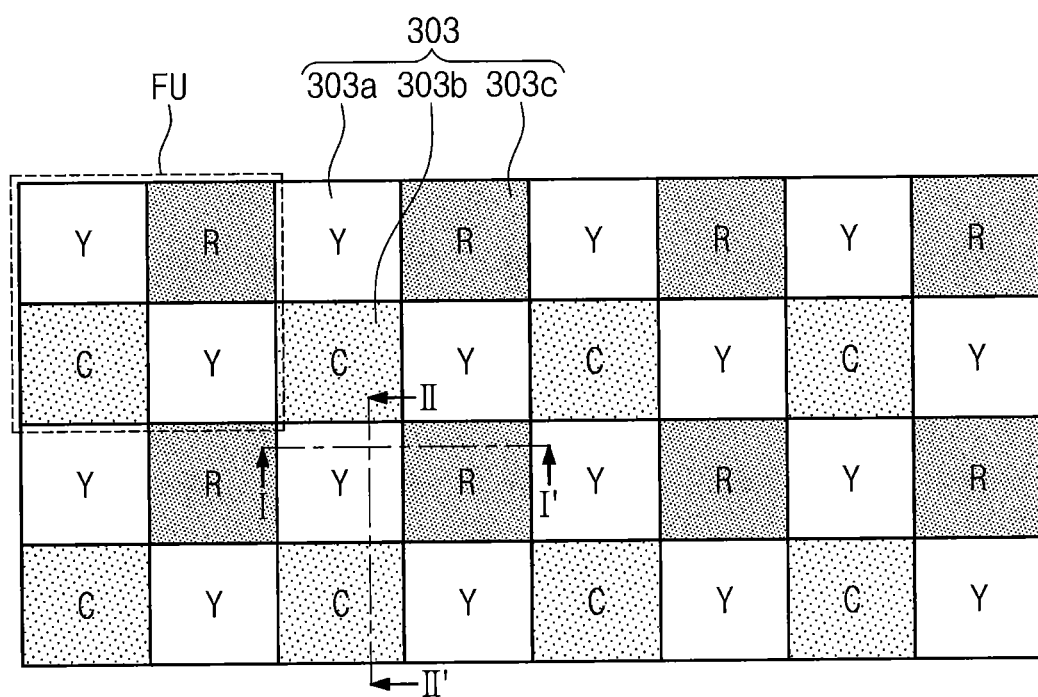
FIG. 3 illustrates a plan view of a color filter array of an image sensor according to example embodiments of the present inventive concept.
Figure 3:
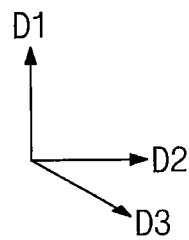

FIG. 3 illustrates a plan view of a color filter array of an image sensor according to example embodiments of the inventive concept.

Referring to FIG. 3, an active pixel sensor array 1 may include color filter units FU (i.e., a group of color filters). The color filter units FU may be two-dimensionally arranged both in a first direction D1 (e.g., column direction) and in a second direction D2 (e.g., a row direction). In some embodiments, each of the first direction D1 and the second direction D2 may be a horizontal direction, and the first direction D1 may be perpendicular to the second direction D2. Each of the color filter units FU may include four color filters 303 that are arranged in a two-by-two (2×2) array (i.e., an array having two rows and two columns). In some embodiments, the four color filters 303 of a single color filter unit FU may be arranged to form a two-by-two (2×2) array, as illustrated in FIG. 3. In some embodiments, each of the color filter units FU may include four color filters 303. In some embodiments, each of the color filter units FU may consist of (i.e., may only include) four color filters 303, as illustrated in FIG. 3. The color filters 303 of the color filter units FU may be disposed to correspond to a plurality of unit pixels.

Each of the color filter units FU may include a first color filter 303a, a second color filter 303b, and a third color filter 303c. The first and second color filters 303a and 303b may be complementary color filters, and the third color filter 303c may be a primary color filter. For example, the first color filter 303a may be a yellow color filter, the second color filter 303b may be a cyan color filter, and the third color filter 303c may be a red color filter. Each of the color filter units FU may include two yellow color filters Y, cyan color filter C, and red color R filter that are arranged in a two-by-two (2×2) array below. In some embodiments, the two yellow color filters Y may be adjacent each other in a diagonal direction (i.e., the third direction D3) with respect to the first direction D1 or the second direction D2 as illustrated in FIG. 3.

$$\begin{bmatrix} Y & R \\ C & Y \end{bmatrix}$$

The first color filter 303a may be configured to allow yellow visible light to pass through, and a unit pixel having the first color filter 303a may generate photo-charges corresponding to the yellow visible light. The second color filter 303b may be configured to allow cyan visible light to pass through, and a unit pixel having the second color filter 303b may generate photo-charges corresponding to the cyan visible light. The third color filter 303c may be configured to allow red visible light to pass through, and a unit pixel having the third color filter 303c may generate photo-charges corresponding to the red visible light.

Figure 4A:
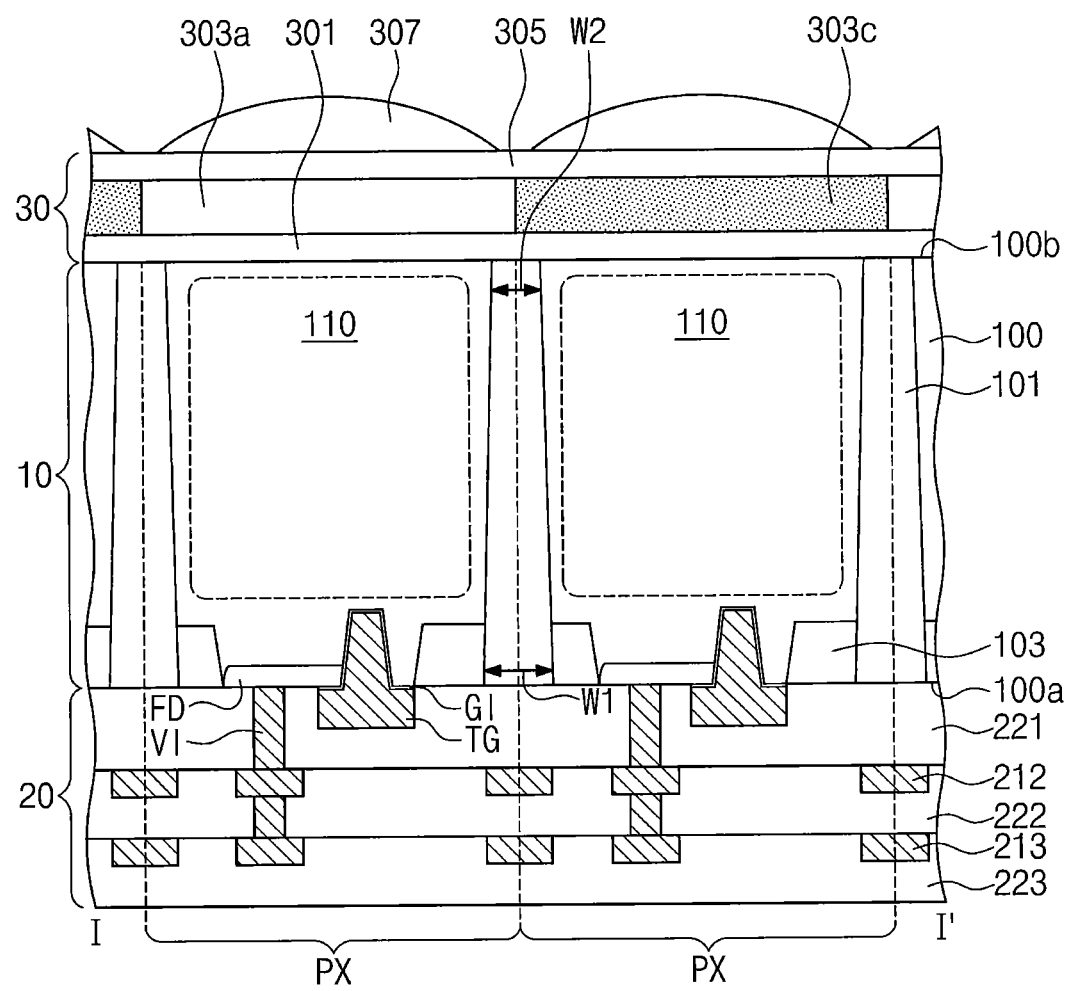
FIGS. 4A and 4B illustrate cross-sectional views respectively taken along the lines I-I' and the II-II' of FIG. 3 according to example embodiments of the present inventive concept.
Figure 4B:
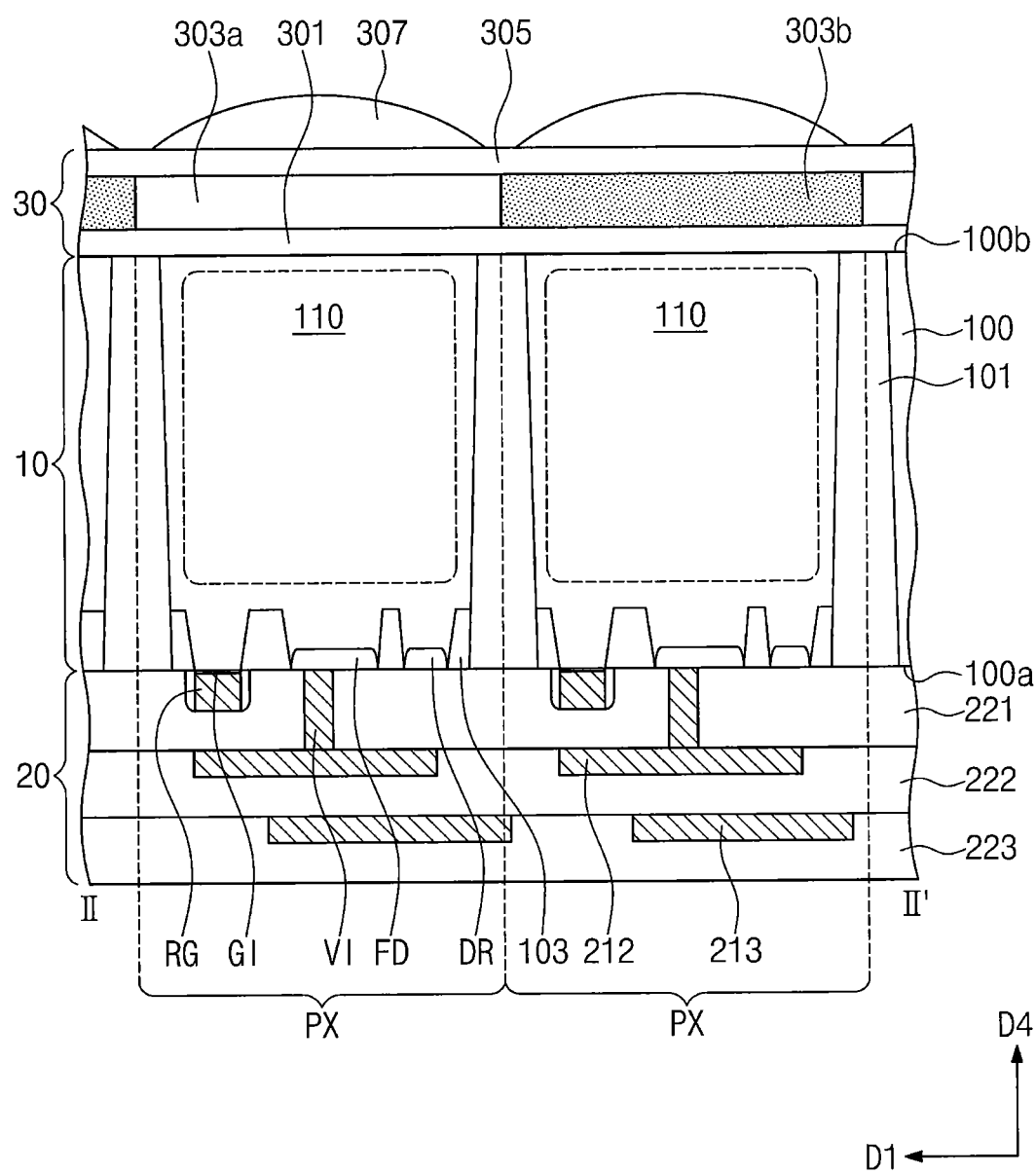

In some embodiments, each of the first color filter 303a, the second color filter 303b, and the third color filter 303c overlaps a single corresponding one of photoelectric conversion regions 110, as illustrated in FIGS. 4A and 4B. In other words, in some embodiments, the first color filter 303a, the second color filter 303b, and the third color filter 303c are in a one-to one relationship with the photoelectric conversion regions 110, as illustrated in FIGS. 4A and 4B.

A single color filter unit FU may be provided with two first color filters 303a. For example, the first to third color filters 303a, 303b, and 303c may be arranged in a Bayer pattern in which the number of first color filters 303a is twice the number of second color filters 303b or the number of third color filters 303c.

In the active pixel sensor array 1, the first color filters 303a may be arranged in a third direction D3. The third direction D3 may intersect both the first and second directions D1 and D2. For example, the first color filters 303a may be adjacent to each other neither in the first direction D1 nor in the second direction D2. In the active pixel sensor array 1, the second and third color filters 303b and 303c may be alternately arranged along the third direction D3. Each of the second and third color filters 303b and 303c may be disposed between neighboring first color filters 303a.

In some embodiments, two first color filters 303a of a single color filter unit FU may be arranged along the third direction D3, as illustrated in FIG. 3. The third direction D3 may be a horizontal direction and may form an angle with the first direction D1 and the second direction D2.

FIGS. 4A and 4B illustrate cross-sectional views respectively taken along the lines I-I' and II-II' of FIG. 3 according to example embodiments of the inventive concept.

Referring to FIGS. 3, 4A, and 4B, an image sensor according to some embodiments of the inventive concept may include a photoelectric conversion layer 10, a wiring line layer 20, and an optical transmittance layer 30. The photoelectric conversion layer 10 may be interposed between the wiring line layer 20 and the optical transmittance layer 30. The photoelectric conversion layer 10 may include a substrate 100 (e.g., semiconductor substrate) and photoelectric conversion regions 110 provided in the substrate 100. The photoelectric conversion regions 110 may convert externally incident light into electrical signals. The photoelectric conversion regions 110 may generate electrical signals in response to incident light. It will be understood that the substrate 100 may include a semiconductor material. Accordingly, the substrate 100 is referred to as a semiconductor substrate 100 herein. However, it should be noted that a substrate 100 may include a non-semiconductor material.

The semiconductor substrate 100 may have a first surface 100a (e.g., a front surface) and a second surface 100b (e.g., a backside surface) opposite to each other. The wiring line layer 20 may be disposed on the first surface 100a of the semiconductor substrate 100, and the optical transmittance layer 30 may be disposed on the second surface 100b of the semiconductor substrate 100. In some embodiments, the first surface 100a of the semiconductor substrate 100 may face the wiring line layer 20, and the second surface 100b of the semiconductor substrate 100 may face the optical transmittance layer 30.

The wiring line layer 20 may include transfer transistors TX, logic transistors RX, SX, and DX, and first and second wiring lines 212 and 213. The transfer transistors TX may be electrically connected to the photoelectric conversion regions 110. The first and second wiring lines 212 and 213 may be connected, through vias VIs, to the transfer transistors TX and the logic transistors RX, SX, and DX. In some embodiments, a single through via VI may extend through a first interlayer dielectric layer 221. The wiring line layer 20 may signally process the electrical signals converted in the photoelectric conversion regions 110. The first and second wiring lines 212 and 213 may be disposed respectively in second and third interlayer dielectric layers 222 and 223 stacked on the first surface 100a of the semiconductor substrate 100. In some embodiments, the first and second wiring lines 212 and 213 may be arranged regardless of arrangement of the photoelectric conversion regions 110. For example, the first and second wiring lines 212 and 213 may cross over the photoelectric conversion regions 110.

The optical transmittance layer 30 may include microlenses 307 and first to third color filters 303a, 303b, and 303c. The optical transmittance layer 30 may focus and/or filter externally incident light, and the photoelectric conversion layer 10 may be provided with the focused and filtered light.

The semiconductor substrate 100 may be, for example, an epitaxial layer formed on a bulk silicon substrate having a first conductivity type (e.g., p-type) that is the same as a conductivity type of the epitaxial layer. The bulk silicon substrate may be removed from the semiconductor substrate 100 in the course of manufacturing an image sensor, and thus the semiconductor substrate 100 may include only the epitaxial layer of the first conductivity type. In some embodiments, the semiconductor substrate 100 may be a bulk semiconductor substrate including a well of the first conductivity type. In some embodiments, the semiconductor substrate 100 may include an epitaxial layer of a second conductivity type (e.g., n-type), a bulk silicon substrate of the second conductivity type, a silicon-on-insulator (SOI) substrate, or various substrate.

The semiconductor substrate 100 may include a plurality of unit pixels PX defined by a first device isolation layer 101. The unit pixels PX may be two-dimensionally arranged both in a first direction D1 and in a second direction D2 intersecting each other. For example, the unit pixels PX may be arranged in a matrix shape along the first and second directions D1 and D2. When viewed in plan, in some embodiments, the first device isolation layer 101 may completely surround each of the unit pixels PX. The first device isolation layer 101 may reduce or possibly prevent photocharges generated from light incident onto each unit pixels PX from randomly drifting into neighboring unit pixels PX. The first device isolation layer 101 may accordingly inhibit or suppress cross-talk phenomenon between the unit pixels PX. In some embodiments, the first device isolation layer 101 may separate the plurality of unit pixels PX from each other. For example, the first device isolation layer 101 may separate and/or isolate (e.g., electrically isolate or physically isolate) the plurality of unit pixels PX from each other.

The first device isolation layer 101 may include an insulating material whose refractive index is less than that (e.g., silicon) of the semiconductor substrate 100. The first device isolation layer 101 may include one or a plurality of insulation layers. For example, the first device isolation layer 101 may include a silicon oxide layer, a silicon oxynitride layer, or a silicon nitride layer.

When viewed in cross-section, the first device isolation layer 101 may extend from the first surface 100a toward the second surface 100b of the semiconductor substrate 100. The first device isolation layer 101 may penetrate the semiconductor substrate 100, while extending along a fourth direction D4. For example, the first device isolation layer 101 may have a depth substantially the same as a vertical thickness of the semiconductor substrate 100. In some embodiments, the first device isolation layer 101 may extend completely through the semiconductor substrate 100, as illustrated in FIGS. 4A and 4B. In some embodiments, as illustrated in FIGS. 4A and 4B, the first device isolation layer 101 may include opposing sides that are spaced apart from each other in a vertical direction (i.e., the fourth direction D4) and the opposing sides of the first device isolation layer 101 may be coplanar with the first surface 100a and the second surface 100b of the semiconductor substrate 100, respectively.

The first device isolation layer 101 may have a width that decreases (e.g., gradually decreases) from the first surface 100a to the second surface 100b of the semiconductor substrate 100. For example, the first device isolation layer 101 may have a first width W1 in the second direction D2 adjacent to the first surface 100a and a second width W2 in the second direction D2 adjacent to the second surface 100b, and the first width W1 may be greater than the second width W2.

In some embodiments, the wiring line layer 20, the photoelectric conversion layer 10, and the optical transmittance layer 30 may be sequentially stacked in the fourth direction D4, as illustrated in FIG. 4A. The fourth direction D4 may be a vertical direction and may be perpendicular to the first, second and third D1, D2, and D3 directions.

The photoelectric conversion regions 110 may be disposed in corresponding unit pixels PX. The photoelectric conversion regions 110 may be doped with impurities having the second conductivity type (e.g., n-type) opposite to a conductive type of the semiconductor substrate 100. For example, the photoelectric conversion regions 110 may be adjacent to the second surface 100b of the semiconductor substrate 100 and vertically spaced apart from the first surface 100a of the semiconductor substrate 100. Each of the photoelectric conversion regions 110 may include a first region adjacent to the first surface 100a and a second region adjacent to the second surface 100b, and the first region and the second region of the photoelectric conversion region 110 may have different impurity concentrations. Each of the photoelectric conversion regions 110 may thus have a potential slope between the first surface 100a and the second surface 100b.

The semiconductor substrate 100 and the photoelectric conversion regions 110 may constitute, for example, photodiodes. In each of the unit pixels PX, the photodiode may be constituted by a p-n junction between the semiconductor substrate 100 of the first conductivity type and the photoelectric conversion region 110 of the second conductivity type. Each of the photoelectric conversion regions 110 constituting the photodiodes may generate and/or accumulate photo-charges in proportion to magnitude of incident light.

The semiconductor substrate 100 may be provided therein with a second device isolation layer 103 that is adjacent to the first surface 100a and defines active patterns (i.e., active regions). Each of the unit pixels PX may include the active pattern. For example, the active pattern may include a floating diffusion region FD and an impurity region DR that are discussed below.

The second device isolation layer 103 may have a width that decreases (e.g., gradually decreases) from the first surface 100a toward the second surface 100b of the semiconductor substrate 100. The second device isolation layer 103 may have a depth in the fourth direction D4 less than a depth of the first device isolation layer 101 in the fourth direction D4. In some embodiments, the second device isolation layer 103 may have a thickness in the fourth direction D4 less than a thickness of the first device isolation layer 101 in the fourth direction D4. The first device isolation layer 101 may vertically overlap a portion of the second device isolation layer 103. The second device isolation layer 103 may include a silicon oxide layer, a silicon oxynitride layer, and/or a silicon nitride layer. For example, the first and second device isolation layers 101 and 103 may be integrally connected to each other.

Each of the unit pixels PX may be provided with a transfer transistor (e.g., TX of FIG. 2). The transfer transistor may include a transfer gate TG and a floating diffusion region FD. The transfer gate TG may include a lower segment inserted into the semiconductor substrate 100 and may also include an upper segment that is connected to the lower segment and protrudes above the first surface 100a of the semiconductor substrate 100. In some embodiments, as illustrated in FIG. 4A, the transfer gate TG may include a portion in the semiconductor substrate 100 and a portion protruding from the semiconductor substrate 100. A gate dielectric layer GI may be interposed between the transfer gate TG and the semiconductor substrate 100. The floating diffusion region FD may have the second conductivity type (e.g., n-type) opposite to a conductivity type of the semiconductor substrate 100.

Each of the unit pixels PX may be provided with a drive transistor (e.g., DX of FIG. 2), a select transistor (e.g., SX of FIG. 2), and a reset transistor (e.g., RX of FIG. 2). The drive transistor may include a drive gate, the select transistor may include a select gate, and the reset transistor may include a reset gate. Impurity regions DR may be provided on an upper portion of the active pattern on opposite sides of each of the drive, select, and reset gates. For example, the impurity regions DR may have the second conductivity type (e.g., n-type) opposite to a conductive type of the semiconductor substrate 100.

The second surface 100b of the semiconductor substrate 100 may be provided thereon with micro-lenses 307 and first to third color filters 303a, 303b, and 303c. Each of the first to third color filters 303a, 303b, and 303c may be disposed on a corresponding one of the unit pixels PX. Each of the micro-lenses 307 may be disposed on a corresponding one of the first to third color filters 303a, 303b, and 303c. A first planarization layer 301 may be disposed between the second surface 100b of the semiconductor substrate 100 and the first to third color filters 303a, 303b, and 303c, and a second planarization layer 305 may be disposed between the micro-lenses 307 and the first to third color filters 303a, 303b, and 303c.

The first and second color filters 303a and 303b may be complementary color filters, and the third color filter 303c may be a primary color filter. For example, the first color filter 303a may be a yellow color filter, the second color filter 303b may be a cyan color filter, and the third color filter 303c may be a red color filter.

Each of the micro-lenses 307 may have a convex shape to focus light that is incident onto the unit pixel PX. The micro-lenses 307 may vertically overlap corresponding photoelectric conversion regions 110. In some embodiments, a single micro-lens 307 may overlap a single photoelectric conversion region 110.

Figure 5A:
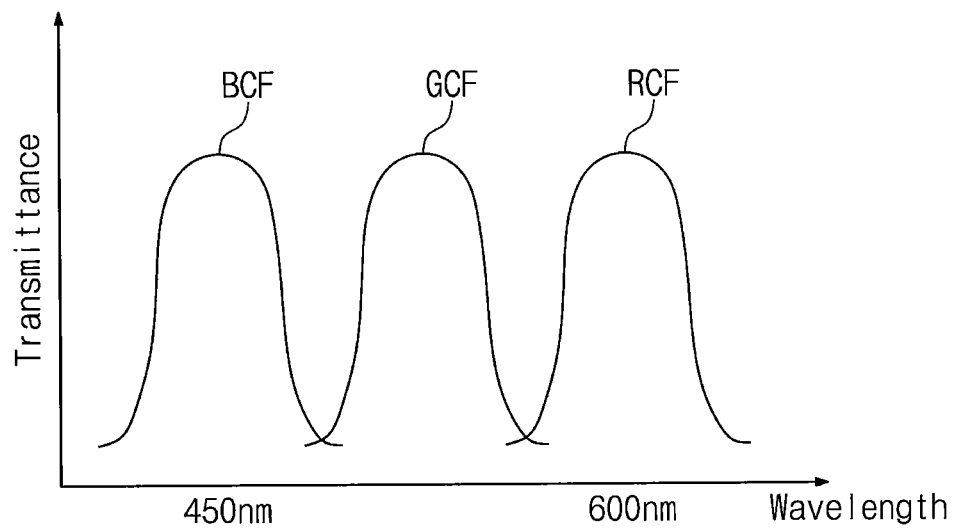
FIG. 5A is a graph showing transmittance characteristics of a primary color filter array according to example embodiments of the present inventive concept.

FIG. 5A is a graph showing transmittance characteristics of a primary color filter array. Referring to FIG. 5A, a primary color filter array may include a red color filter RCF, a green color filter GCF, and a blue color filter BCF. The blue color filter BCF may be transparent to blue light whose wavelength is about 450 nm. The green color filter GCF may be transparent to green light whose wavelength is about 530 nm. The red color filter RCF may be transparent to red light whose wavelength is about 600 nm. The primary color filter array may be transparent to three primary colors of red, green, and blue, thereby achieving relatively excellent sharpness. In contrast, the primary color filter array may decrease pixel sensitivity.

Figure 5B:
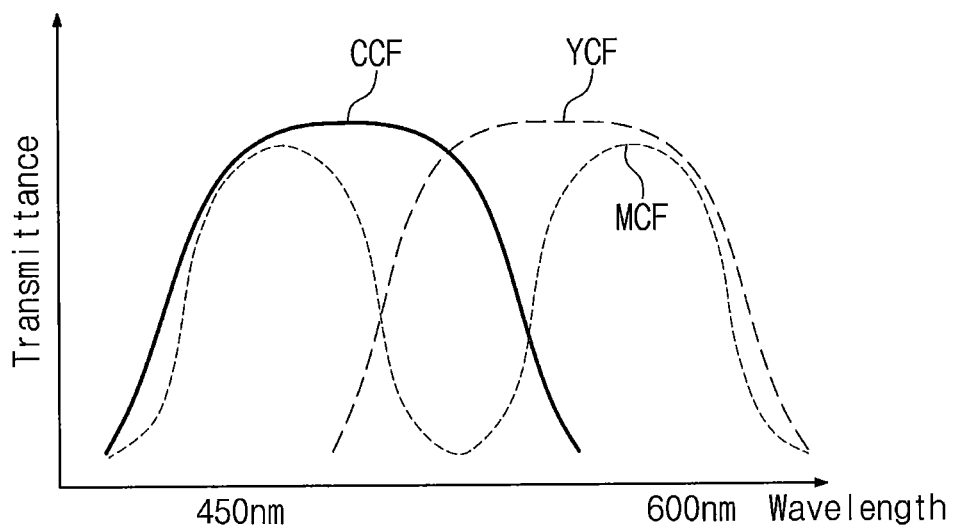
FIG. 5B is a graph showing transmittance characteristics of a complementary color filter array according to example embodiments of the present inventive concept.

FIG. 5B is a graph showing transmittance characteristics of a complementary color filter array. Referring to FIG. 5B, a complementary color filter array may include a cyan color filter CCF, a magenta color filter MCF, and a yellow color filter YCF. Cyan, magenta, and yellow colors may respectively have a complementary relationship with red, green, and blue colors, i.e., the three primary colors. The cyan color filter CCF may be transparent to cyan light whose wavelength falls within a range from about 400 nm to about 550 nm. The yellow color filter YCF may be transparent to yellow light whose wavelength falls within a range from about 500 nm to about 650 nm. The magenta color filter MCF may be transparent to magenta light whose wavelength falls within a range from about 450 nm to about 600 nm. The magenta color filter MCF may be opaque to green light whose wavelength is about 530 nm.

The complementary color filter of FIG. 5B may transmit light whose wavelength range is wider than that of light passing through the primary color filter array of FIG. 5A. The complementary color filter array may accordingly have pixel sensitivity superior to that of the primary color filter array. In contrast, the complementary color filter array may have sharpness less than that of the primary color filter array.

Figure 6:
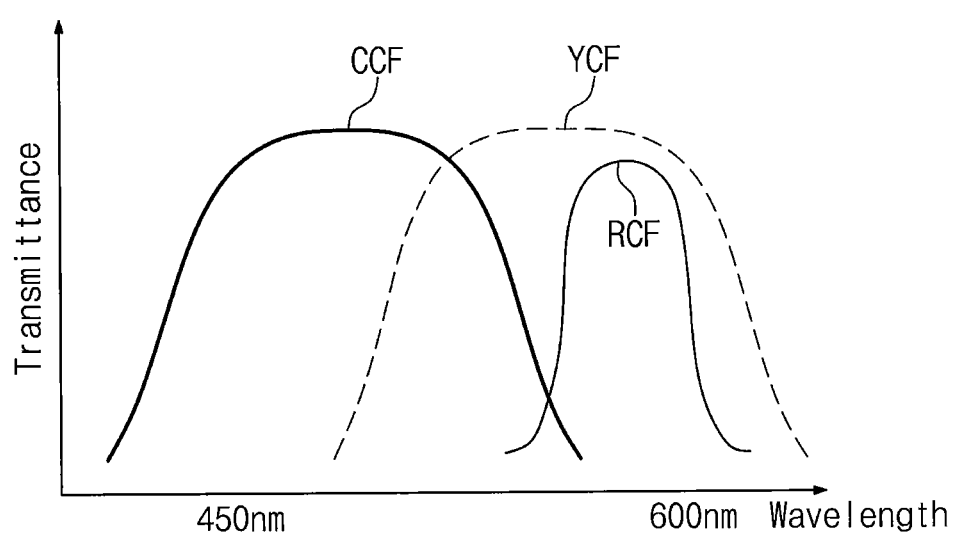
FIG. 6 is a graph showing transmittance characteristics of a color filter array according to example embodiments of the present inventive concept.

FIG. 6 is a graph showing transmittance characteristics of a color filter array according to example embodiments of the inventive concept. Referring to FIG. 6, a color filter array according to example embodiments of the inventive concept may include two complementary color filters (e.g., cyan and yellow colors) and one primary color filter (e.g., red color). The color filter array of the inventive concept may transmit light whose wavelength range is wider than that of light passing through the primary color filter array of FIG. 5A. The color filter array according to example embodiments of the inventive concept may accordingly have pixel sensitivity superior to that of the primary color filter array. The color filter array of the inventive concept may exactly transmit red light, compared to the complementary color filter array of FIG. 5B. The color filter array of the inventive concept may therefore have sharpness greater than that of the complementary color filter array.

Figure 7:
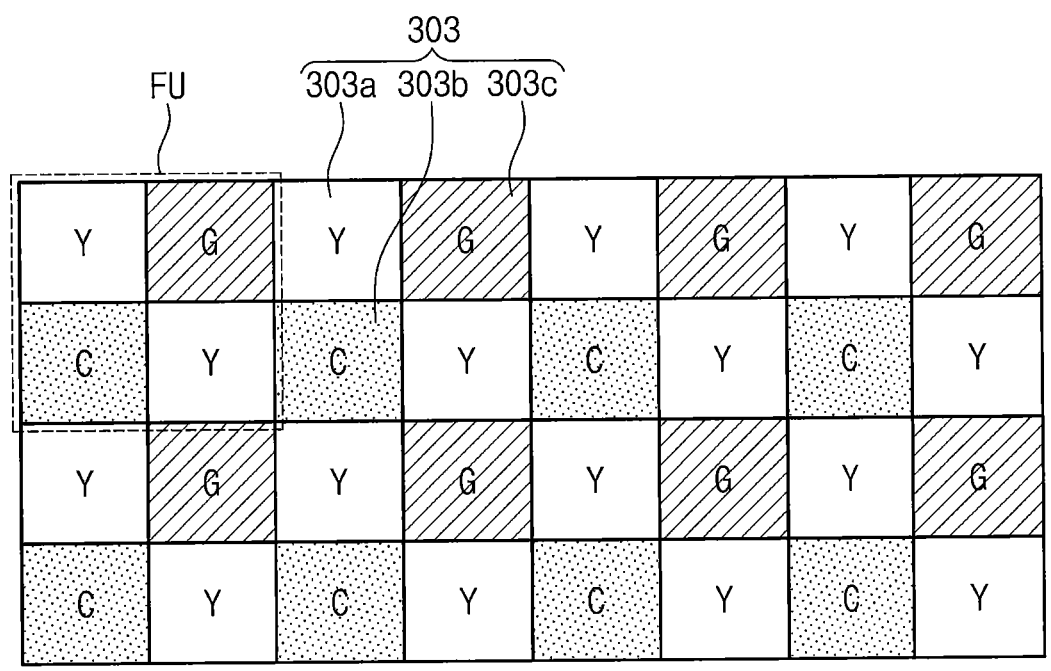
FIG. 7 illustrates a plan view of a color filter array of an image sensor according to example embodiments of the present inventive concept.

FIG. 7 illustrates a plan view of a color filter array of an image sensor according to example embodiments of the inventive concept. A detailed description of technical features repetitive to those discussed above with reference to FIG. 3 may be omitted, and differences will be discussed in detail. Referring to FIG. 7, each of the color filter units FU may include two first color filters 303a, a second color filter 303b, and a third color filter 303c. The third color filter 303c may be a green color filter.

Figure 8A:
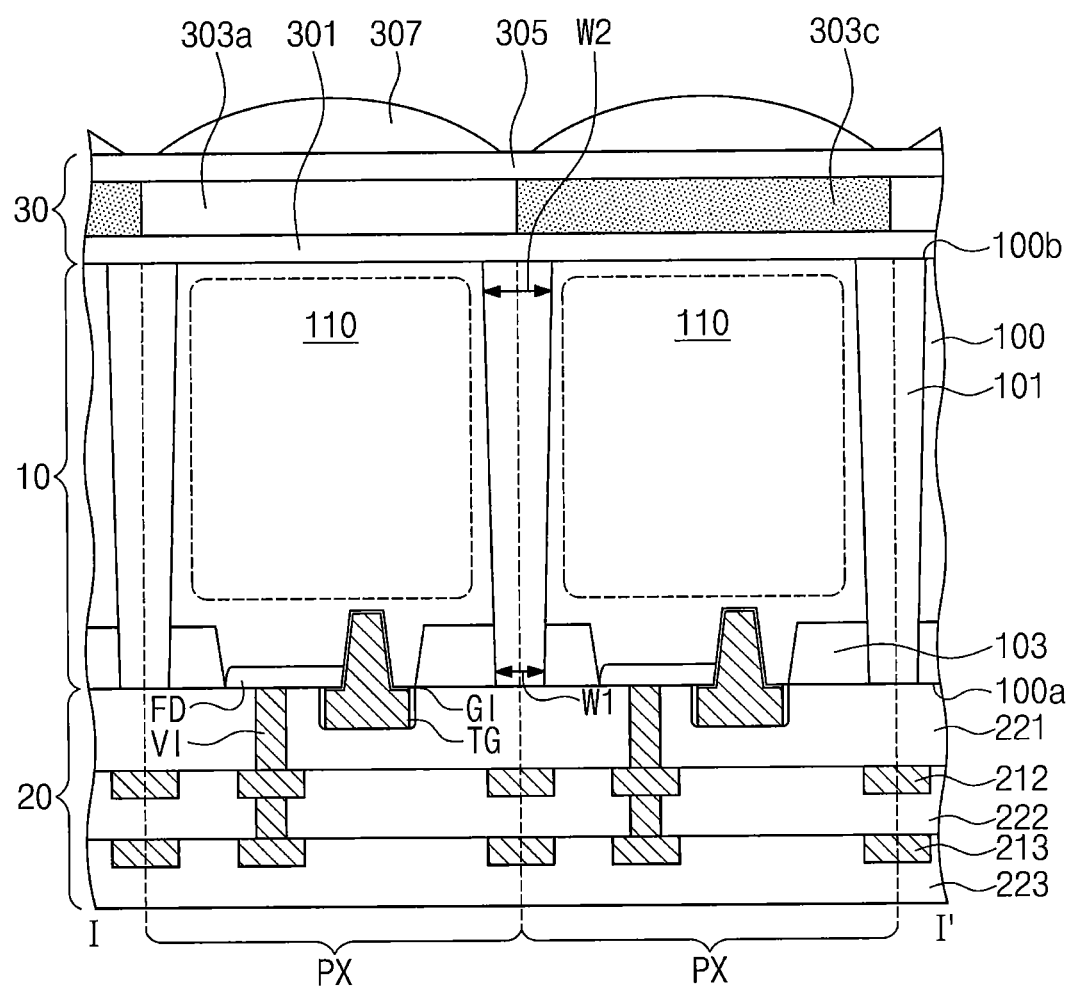
FIGS. 8A, 8B, 9A, 9B, 10A, and 10B illustrate cross-sectional views of an image sensor according to example embodiments of the present inventive concept.
Figure 8B:
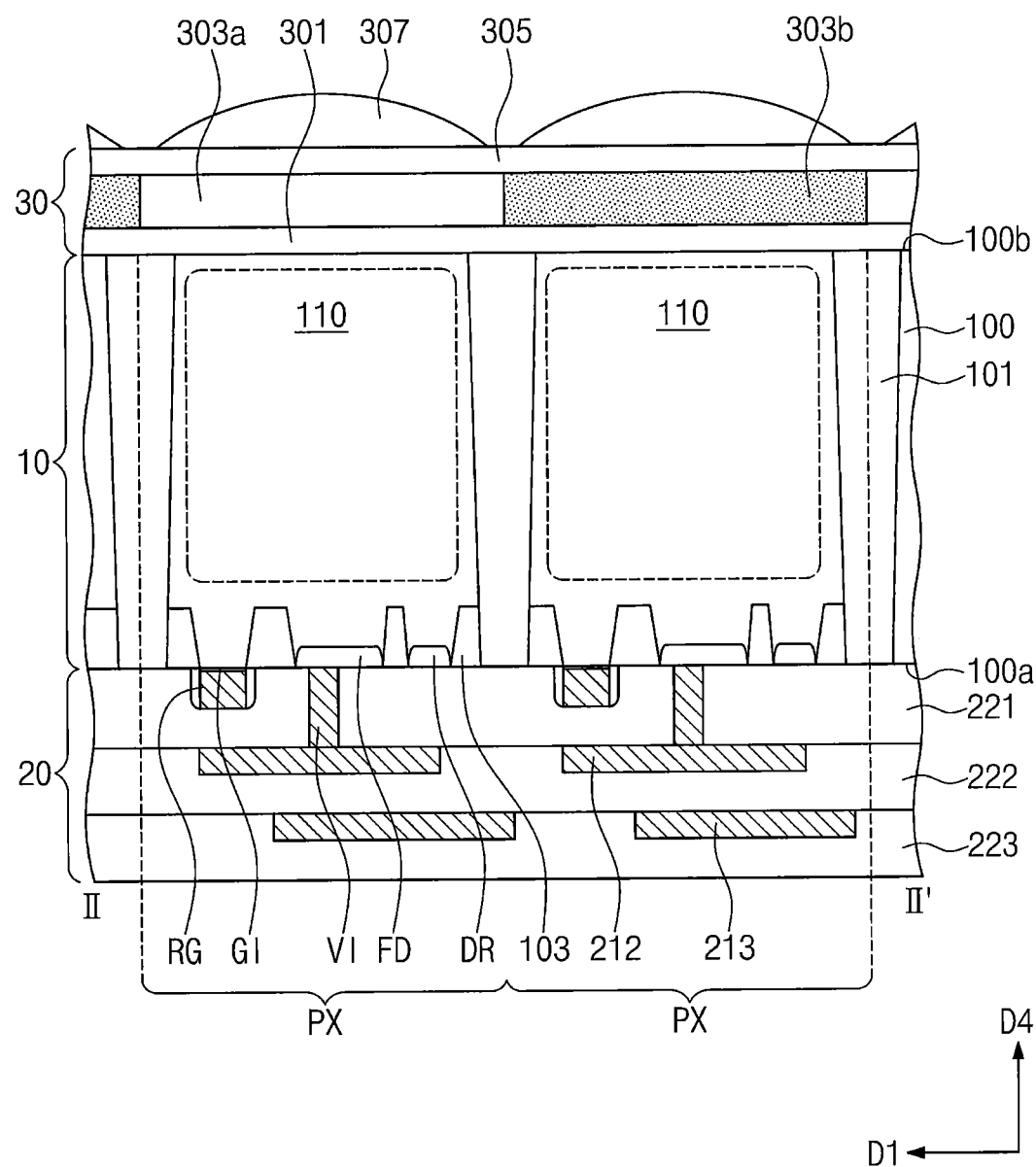
Figure 9A:
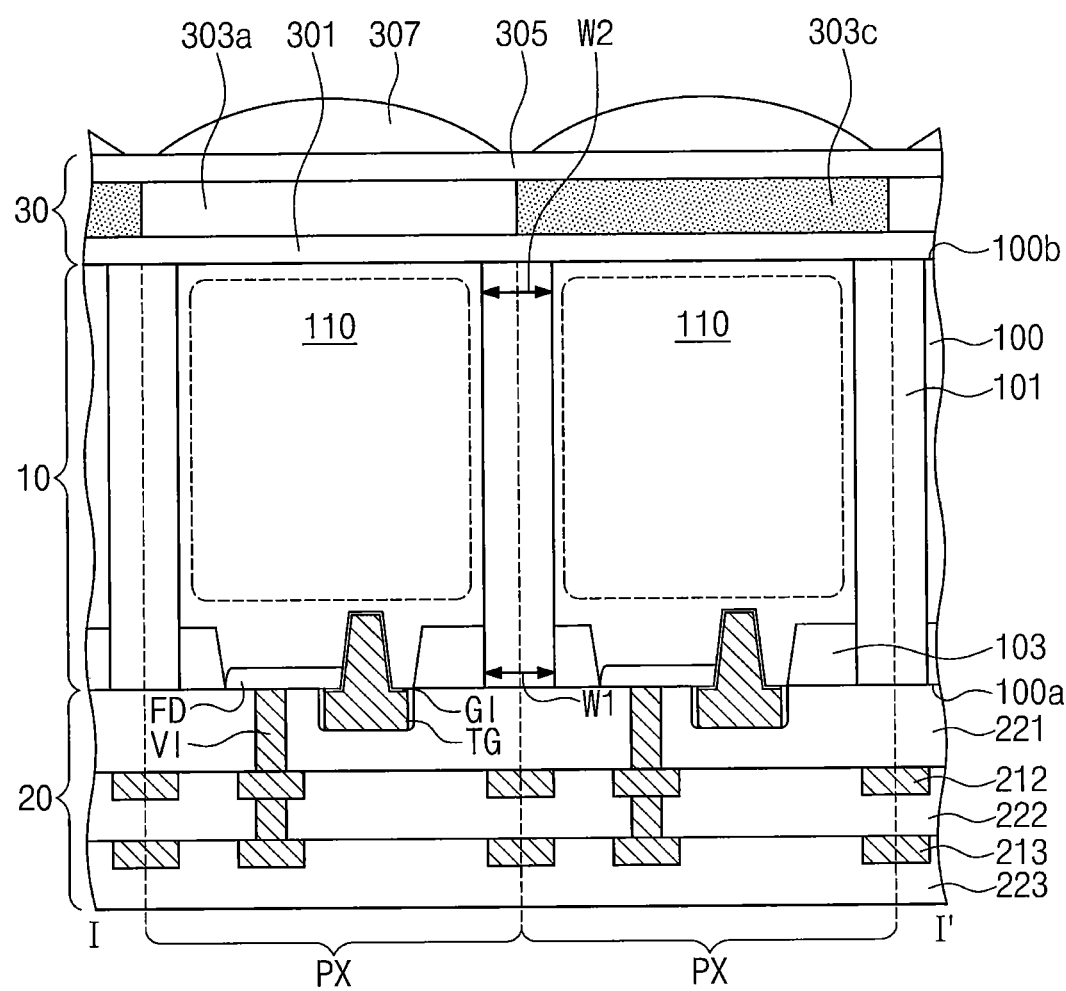
Figure 9B:
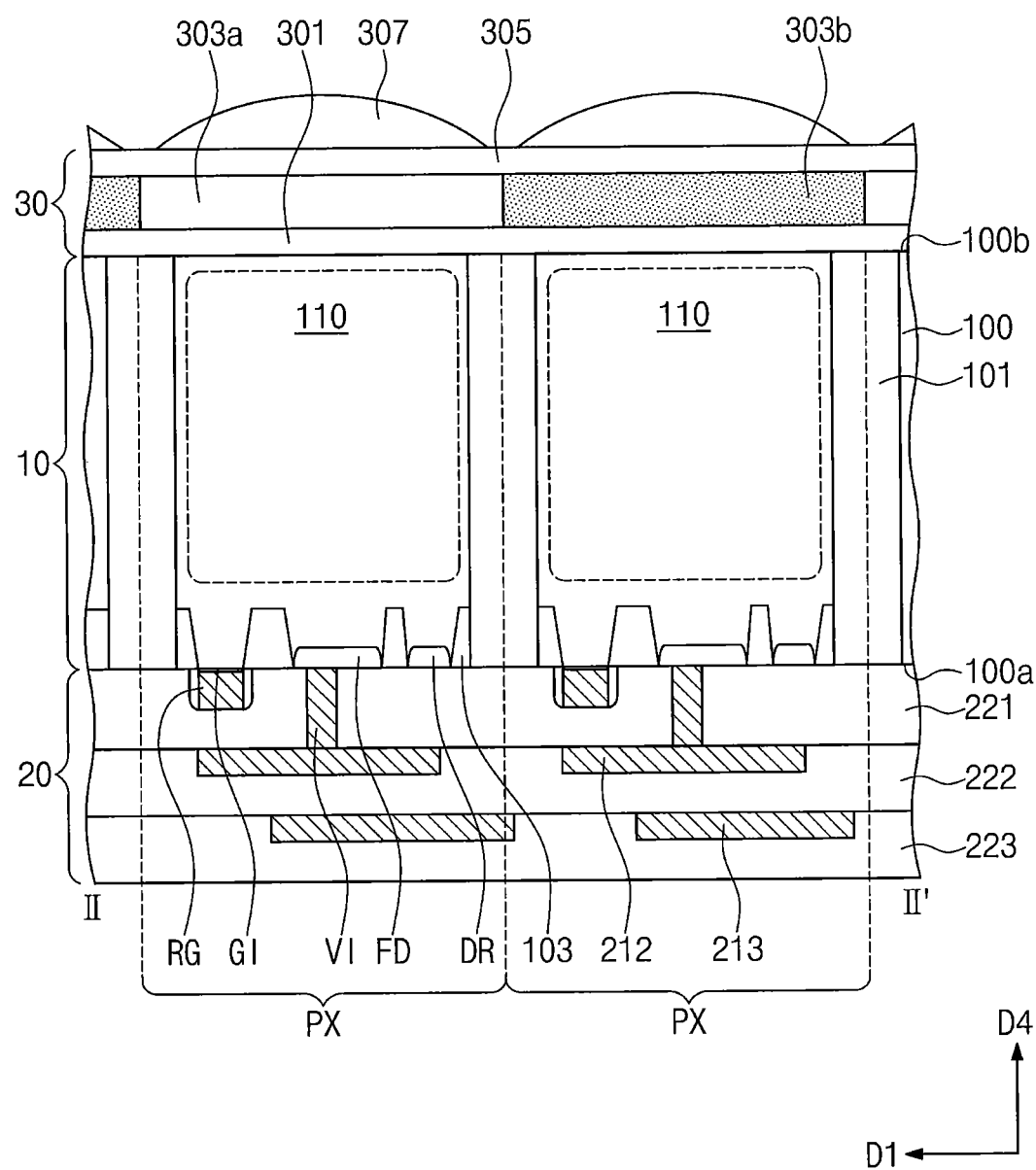
Figure 10A:
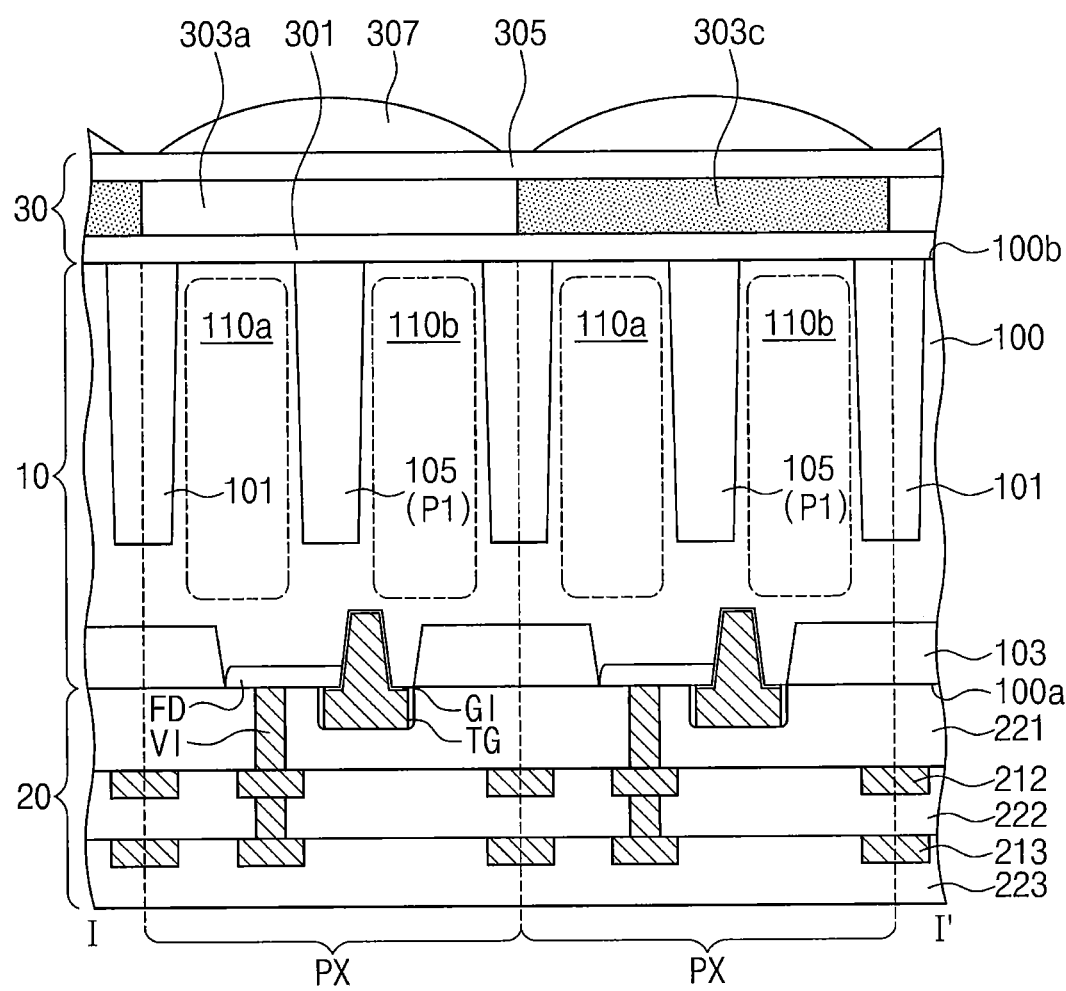

FIGS. 8A, 8B, 9A, 9B, 10A, and 10B illustrate cross-sectional views of an image sensor according to example embodiments of the inventive concept. FIGS. 8A, 9A, and 10A illustrate cross-sectional views taken along the line I-I' of FIG. 3, and FIGS. 8B, 9B, and 10B illustrate cross-sectional views taken along the line II-II' of FIG. 3. A detailed description of technical features repetitive to those discussed above with reference to FIGS. 3, 4A, and 4B may be omitted, and differences will be discussed in detail.

Referring to FIGS. 3, 8A, and 8B, the first device isolation layer 101 may have a width that gradually increase from the first surface 100a toward the second surface 100b. The first device isolation layer 101 may have a first width W1 adjacent to the first surface 100a and a second width W2 adjacent to the second surface 100b, and the second width W2 may be greater than the first width W1.

Referring to FIGS. 3, 9A, and 9B, the first device isolation layer 101 may have a constant width regardless of a depth of the first device isolation layer 101. In some embodiments, the first device isolation layer 101 may have a uniform width in a horizontal direction (e.g., the second direction D2) along a vertical direction (e.g., the fourth direction D4), as illustrated in FIG. 9A. The first device isolation layer 101 may have a first width W1 adjacent to the first surface 100a and a second width W2 adjacent to the second surface 100b, and the first and second widths W1 and W2 may be substantially the same as each other. For example, a difference between the first and second widths W1 and W2 may be less than 3%, 5%, 10% or 15% of the first and second widths W1 and W2.

Figure 10B:
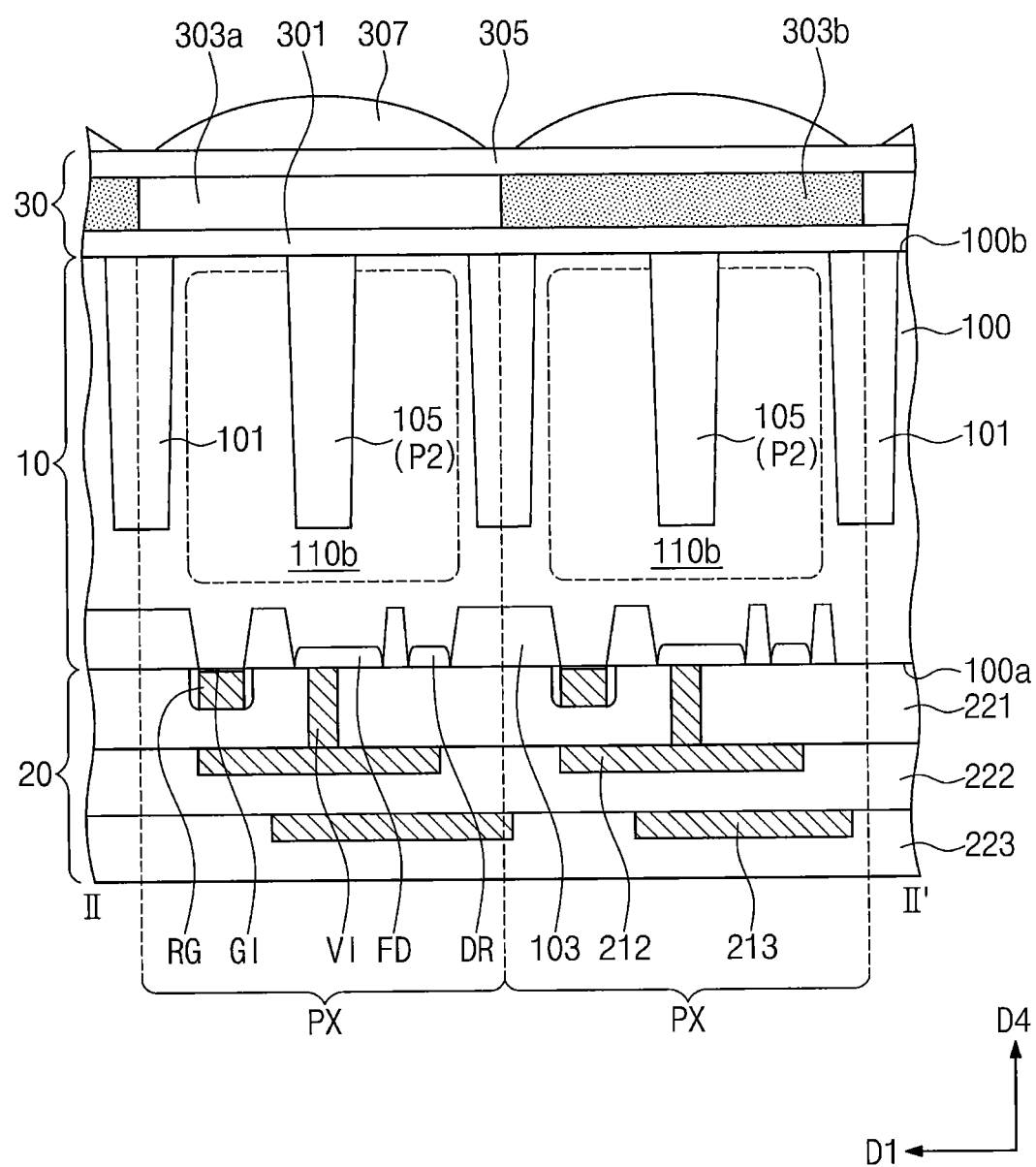

Referring to FIGS. 3, 10A, and 10B, the photoelectric conversion layer 10 may include a semiconductor substrate 100 and first and second photoelectric conversion regions 110a and 110b that are provided in the semiconductor substrate 100. The first and second photoelectric conversion regions 110a and 110b may convert externally incident light into electrical signals. A pair of first and second photoelectric conversion regions 110a and 110b may be provided in each of the unit pixels PX. Each of the first and second photoelectric conversion regions 110a and 110b may be doped with impurities having the second conductivity type (e.g., n-type) opposite to a conductivity type of the semiconductor substrate 100.

Each of the first and second photoelectric conversion regions 110a and 110b may include a first region adjacent to the first surface 100a and a second region adjacent to the second surface 100b, and the first and second regions have different impurity concentrations. Each of the first and second photoelectric conversion regions 110a and 110b may then have a potential slope between the first and second surfaces 100a and 100b of the semiconductor substrate 100.

The semiconductor substrate 100 and the first and second photoelectric conversion regions 110a and 110b may constitute a pair of photo diodes. In each of the unit pixels PX, the pair of photodiodes may be constituted by p-n junctions between the semiconductor substrate 100 of the first conductivity and the first conversion region 110a and between the semiconductor substrate 100 of the first conductivity and the second photoelectric conversion region 110b of the second conductivity.

In each of the unit pixels PX, a difference in phase (e.g., phase offset or phase difference) may be provided between an electrical signal output from the first photoelectric conversion region 110a and an electrical signal output from the second photoelectric conversion region 110b. In an image sensor illustrated in FIGS. 10A and 10B, correction in focus may be performed by comparing the difference in phase between the electrical signals output from a pair of the first and second photoelectric conversion regions 110a and 110b.

In each of the unit pixels PX, a third device isolation layer 105 may be disposed between the first and second photoelectric conversion regions 110a and 110b. When viewed in plan, the third device isolation layer 105 may include a first part P1 extending in the first direction D1 while running across one unit pixel PX and a second part P2 extending in the second direction D2 while running across the one unit pixel PX. For example, the third device isolation layer 105 may have a cross shape in a plan view. The first part P1 of the third device isolation layer 105 may be disposed between the first and second photoelectric conversion regions 110a and 110b. The second part P2 of the third device isolation layer 105 may run across the first and second photoelectric conversion regions 110a and 110b. The third device isolation layer 105 may extend from the second surface 100b toward the first surface 100a of the semiconductor substrate 100. The third device isolation layers 105 may be spaced apart from the first surface 100a of the semiconductor substrate 100. In some embodiments, the third device isolation layers 105 may not extend through the semiconductor substrate 100 and thus may be vertically spaced apart from the first surface 100a of the semiconductor substrate 100 as illustrated in FIGS. 10A and 10B.

In some embodiments, the first device isolation layer 101 and the third device isolation layer 105 may be formed at the same time (e.g., concurrently). In some embodiments, the third device isolation layer 105 may include the same insulating material as that of the first device isolation layer 101. The third device isolation layer 105 may be integrally connected to the first device isolation layer 101. In some embodiments, the third device isolation layer 105 and the first device isolation layer 101 may have a unitary structure, and an interface between the third device isolation layer 105 and the first device isolation layer 101 may not be visible.

The third device isolation layer 105 may reduce or possibly prevent cross-talk between the first and second photoelectric conversion regions 110a and 110b in each of the unit pixels PX. Accordingly, each of the unit pixels PX may be configured to detect (e.g., exactly detect) a phase difference of an electrical signal. As a result, an image sensor according to some embodiments of the inventive concept may have an increased auto-focusing function.

According to inventive concept, an image sensor may have pixel sensitivity superior to that of a primary color filter array including (e.g., consisting of) red, green, and blue colors. Also, the image sensor may have sharpness (e.g., image sharpness) superior to that of a complementary color filter array including (e.g., consisting of) cyan, magenta, and yellow colors.

Although example embodiments of the inventive concept have been discussed with reference to accompanying figures, it will be understood that various changes in form and details may be made therein without departing from the spirit and scope of the inventive concept. It therefore will be understood that the embodiments described above are just illustrative, not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. An image sensor comprising:
a plurality of unit pixels; and
a color filter array on the plurality of unit pixels,
wherein the color filter array comprises a color filter unit comprising four color filters that are arranged in a two-by-two array, and
wherein the color filter unit comprises two yellow color filters, a cyan color filter, and a red color filter.

2. The image sensor of claim 1, wherein a first row of the two-by-two array of the color filter unit comprises the cyan color filter and a first one of the two yellow color filters, and
wherein a second row of the two-by-two array of the color filter unit comprises a second one of the two yellow color filters that is adjacent to the first one of the two yellow color filters in a diagonal direction with respect to a row direction.

3. The image sensor of claim 1, wherein the color filter unit comprises a plurality of color filter units that comprises a plurality of yellow color filters, a plurality of cyan color filters, and a plurality of red color filters, and
wherein the plurality of yellow color filters, the plurality of cyan color filters, and the plurality of red color filters of the plurality of color filter units are in a Bayer pattern.

4. The image sensor of claim 1 further comprising a substrate comprising a first surface and a second surface opposite the first surface,
wherein each of the plurality of unit pixels comprises a photoelectric conversion region in the substrate, and
wherein the first surface of the substrate faces the color filter array.

5. The image sensor of claim 4, wherein the substrate has a first conductivity type, and
wherein the photoelectric conversion region of each of the plurality of unit pixels has a second conductivity type different from the first conductivity type.

6. The image sensor of claim 4, wherein each of the plurality of unit pixels further comprises a plurality of transistors on the second surface of the substrate.

7. The image sensor of claim 4 further comprising a device isolation layer in the substrate, wherein the device isolation layer isolates the plurality of unit pixels from each other.

8. The image sensor of claim 7, wherein the first surface and the second surface of the substrate are spaced apart from each other in a vertical direction, and
wherein the device isolation layer has a first width in a horizontal direction adjacent to the first surface of the substrate and has a second width in the horizontal direction adjacent to the second surface of the substrate, and the first width is different from the second width.

9. An image sensor comprising:
a color filter unit comprising two yellow color filters, a cyan color filter, and a red color filter that are in a two-by-two array:

$$\begin{bmatrix} Y & R \\ C & Y \end{bmatrix}$$

wherein Y represents one of the two yellow color filters, C represents the cyan color filter, and R represents the red color filter.

10. The image sensor of claim 9, wherein the color filter unit comprises a plurality of color filter units that are arranged two-dimensionally.

11. The image sensor of claim 9, wherein the color filter unit comprises a plurality of color filter units that comprise a plurality of yellow color filters, a plurality of cyan color filters, and a plurality of red color filters, and
wherein the plurality of yellow color filters, the plurality of cyan color filters, and the plurality of red color filters of the plurality of color filter units are in a Bayer pattern.

12. The image sensor of claim 9, further comprising a plurality of unit pixels arranged in a two-by-two array,
wherein each of the plurality of unit pixels is in one-to-one relationship with one of the yellow color filters, the cyan color filter, or the red color filter of the color filter unit,
wherein each of the plurality of unit pixels comprises:
a photoelectric conversion device;
a transfer transistor configured to control transfer of charges generated in the photoelectric conversion device; and
a floating diffusion region configured to receive the charges.

13. The image sensor of claim 12, further comprising a substrate, wherein the photoelectric conversion device comprises a photoelectric conversion region in the substrate, wherein the substrate has a first conductivity type, and wherein the photoelectric conversion region has a second conductivity type that is different from the first conductivity type.

14. An image sensor comprising:

a substrate including a plurality of photoelectric conversion devices; and a color filter unit on the substrate, wherein the color filter unit comprises four color filters that comprise two first color filters, a second color filter, and a third color filter that are in a two-by-two array:

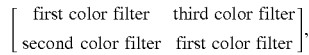

wherein each of the two first color filters and the second color filter is a complementary color filter, and wherein the third color filter is a primary color filter that is a red color filter.

15. The image sensor of claim 14, wherein colors of the second and third color filters have a complementary relationship with each other.

16. The image sensor of claim 14, wherein each of the two first color filters is a yellow color filter, and the second color filter is a cyan color filter.

17. The image sensor of claim 14, wherein the color filter unit comprises a plurality of color filter units, and wherein the first, second and third color filters of the plurality of color filter units are in a Bayer pattern.

18. The image sensor of claim 14, wherein each of the first, second and third color filters overlaps a respective one of the plurality of photoelectric conversion devices.

19. The image sensor of claim 14, wherein each of the first, second and third color filters overlaps a pair of the plurality of photoelectric conversion devices.

20. The image sensor of claim 14, wherein each of the plurality of photoelectric conversion devices comprises a photoelectric conversion region in the substrate, wherein the substrate has a first conductivity type, and wherein the photoelectric conversion region has a second conductivity type that is different from the first conductivity type.

* * * * *